(12) United States Patent
Wheeler et al.

(10) Patent No.: US 12,223,328 B2
(45) Date of Patent: Feb. 11, 2025

(54) GENERATING AND EXECUTING A CONTROL FLOW

(71) Applicant: Lodestar Licensing Group, LLC, Evanston, IL (US)

(72) Inventors: Kyle B. Wheeler, Acton, MA (US); Richard C. Murphy, Boise, ID (US); Troy A. Manning, Meridian, ID (US); Dean A. Klein, Eagle, ID (US)

( * ) Notice: Subject to any disclaimer, the term of this patent is extended or adjusted under 35 U.S.C. 154(b) by 0 days.

(21) Appl. No.: 18/448,079

(22) Filed: Aug. 10, 2023

(65) Prior Publication Data

US 2024/0036877 A1 Feb. 1, 2024

Related U.S. Application Data

(63) Continuation of application No. 17/743,062, filed on May 12, 2022, now Pat. No. 11,726,791, which is a continuation of application No. 17/027,431, filed on Sep. 21, 2020, now Pat. No. 11,334,362, which is a continuation of application No. 16/112,577, filed on Aug. 24, 2018, now Pat. No. 10,782,980, which is a
(Continued)

(51) Int. Cl.
| | |
|---|---|
| *G06F 9/38* | (2018.01) |
| *G06F 15/78* | (2006.01) |
| *G11C 7/06* | (2006.01) |
| *G11C 7/10* | (2006.01) |
| *G11C 11/408* | (2006.01) |
| *G11C 11/4096* | (2006.01) |

(52) U.S. Cl.
CPC ........ *G06F 9/3877* (2013.01); *G06F 15/7821* (2013.01); *G11C 7/06* (2013.01); *G11C 7/065* (2013.01); *G11C 7/1006* (2013.01); *G11C 7/1036* (2013.01); *G11C 11/4087* (2013.01); *G11C 11/4096* (2013.01)

(58) Field of Classification Search
None
See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| (Continued) | | | |

FOREIGN PATENT DOCUMENTS

| | | |
|---|---|---|
| CN | 1379879 | 11/2002 |
| CN | 101127901 | 2/2008 |
| (Continued) | | |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Eric Coleman

(57) ABSTRACT

Examples of the present disclosure provide apparatuses and methods related to generating and executing a control flow. An example apparatus can include a first device configured to generate control flow instructions, and a second device including an array of memory cells, an execution unit to execute the control flow instructions, and a controller configured to control an execution of the control flow instructions on data stored in the array.

20 Claims, 8 Drawing Sheets

Related U.S. Application Data continuation of application No. 14/980,024, filed on Dec. 28, 2015, now Pat. No. 10,061,590.

(60) Provisional application No. 62/100,717, filed on Jan. 7, 2015.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,485,629 A | 1/1996 | Dulong |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,696,956 A | 12/1997 | Razdan et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,128,733 A | 10/2000 | Miyaguchi et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,760,833 B1 | 7/2004 | Dowling |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,928,377 B2 | 8/2005 | Eustis et al. |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,970,988 B1 | 11/2005 | Chung |
| 6,985,394 B2 | 1/2006 | Kim |
| 6,987,693 B2 | 1/2006 | Cernea et al. |
| 7,020,017 B2 | 3/2006 | Chen et al. |
| 7,028,136 B1 | 4/2006 | Priyadarshan et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,185,179 B1 | 2/2007 | Furusho |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,415,689 B2 | 8/2008 | Taylor |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,596,679 B2 | 9/2009 | Abbo et al. |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,859,900 B2 | 12/2010 | Hsiao et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |

(56) References Cited

U.S. PATENT DOCUMENTS

| | | |
|---|---|---|
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,650,447 B1 | 2/2014 | Wortman et al. |
| 8,710,863 B2 | 4/2014 | Kilzer et al. |
| 8,873,272 B2 | 10/2014 | Lee |
| 8,964,496 B2 | 2/2015 | Manning |
| 8,971,124 B1 | 3/2015 | Manning |
| 9,015,390 B2 * | 4/2015 | Klein ................... G06F 9/3879 710/5 |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2001/0052062 A1 | 12/2001 | Lipovski |
| 2002/0059355 A1 | 5/2002 | Peleg et al. |
| 2002/0100032 A1 * | 7/2002 | Metzgen ................. G06F 30/30 717/154 |
| 2003/0018868 A1 | 1/2003 | Chung |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0044107 A1 | 2/2008 | Horisaki |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0044179 A1 | 2/2009 | Luszczek et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0093665 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0070549 A1 * | 3/2013 | Ghosh .................... G11C 7/067 365/203 |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0130023 A1 * | 5/2014 | Chen ........................ G06F 8/41 717/140 |
| 2014/0133237 A1 | 5/2014 | Sprouse et al. |
| 2014/0136761 A1 | 5/2014 | Li et al. |
| 2014/0149680 A1 * | 5/2014 | Fleischer ............ G06F 12/0888 711/138 |
| 2014/0185395 A1 | 7/2014 | Seo |
| 2014/0215185 A1 | 7/2014 | Danielsen |
| 2014/0250279 A1 | 9/2014 | Manning |
| 2014/0281629 A1 * | 9/2014 | Bose ..................... G06F 1/3243 713/323 |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |

(56) References Cited

U.S. PATENT DOCUMENTS

| | | |
|---|---|---|
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |

FOREIGN PATENT DOCUMENTS

| | | |
|---|---|---|
| CN | 102141905 | 8/2011 |
| EP | 0214718 | 3/1987 |
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | I317131 | 11/2009 |
| TW | I336890 | 2/2011 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, mailed Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. Number 13/796,189, entitled, "Performing Complex Arithmetic Functions in a Memory Device," filed Mar. 12, 2013, (23 pgs.).
Office Action for related Taiwan Patent Application No. 105100417, dated Nov. 16, 2016, 14 pages.
Office Action for related Taiwan Patent Application No. 105100417, dated Jun. 19, 2017, 12 pages.
Decision of Rejection for related Taiwan Patent Application No. 105100417, dated Jan. 2, 2018, 12 pages.
Kowarik et al., "Associative and Data Processing Mbit-DRAM", Proceedings of the 1990 International Conference on Computer Design: VLSI in Computer And Processors, Sep. 17-19, 1990, Cambridge, MA, pp. 421-424.
Extended European Search Report and Written Opinion for related EP Application No. 16735388.7, dated Jun. 29, 2018, 11 pages.
Communication Pursuant to Article 94(3) EPC for related EP Application No. 16735388.7, dated Apr. 5, 2019, 8 pages.
Office Action for related China Patent Application No. 201680008571.7, dated Mar. 17, 2020, 40 pages.

* cited by examiner

TABLE 8-1

| A (844) | B (845) | NOT OPEN (856) | OPEN TRUE (870) | OPEN INVERT (871) |
|---|---|---|---|---|
| 0 | 0 | 0 | 0 | 1 |
| 0 | 1 | 0 | 1 | 0 |

875

| 1 | 0 | 1 | 0 | 1 |
| 1 | 1 | 1 | 1 | 0 |

TABLE 8-2

| | FF | 0 | 0 | 0 | 0 | 0 | 0 | 1 | 1 | 1 | ← 876 |
| | FT | 0 | 0 | 0 | 1 | 1 | 1 | 0 | 0 | 0 | ← 877 |
| | TF | 0 | 0 | 1 | 0 | 0 | 1 | 0 | 0 | 1 | ← 878 |
| | TT | 0 | 1 | 0 | 0 | 1 | 0 | 0 | 1 | 0 | ← 879 |
| A | B | A | A*B | A*$\bar{B}$ | A+B | B | AXB | A+$\bar{B}$ | $\overline{AXB}$ | $\bar{B}$ | ← 847 |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

(876–879 grouped as 880)

GENERATING AND EXECUTING A CONTROL FLOW

PRIORITY INFORMATION

This application is a Continuation of U.S. application Ser. No. 17/743,062, filed May 12, 2022, which issues as U.S. Pat. No. 11,726,791 on Aug. 15, 2023, which is a Continuation of U.S. application Ser. No. 17/027,431, filed Sep. 21, 2020, which issued as U.S. Pat. No. 11,334,362 on May 17, 2022, which is a Continuation of U.S. application Ser. No. 16/112,577, filed Aug. 24, 2018, which issued as U.S. Pat. No. 10,782,980 on Sep. 22, 2020, which is a Continuation of U.S. application Ser. No. 14/980,024, filed Dec. 28, 2015, which issued as U.S. Pat. No. 10,061,590 on Aug. 28, 2018, which claims the benefit of U.S. Provisional Application No. 62/100,717, filed Jan. 7, 2015, the contents of which are included by reference.

TECHNICAL FIELD

The present disclosure relates generally to semiconductor memory apparatuses and methods, and more particularly, to apparatuses and methods related to generating and executing a control flow.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions (e.g., control flow) and store the results of the executed instructions to a suitable location. A processor can comprise a number of functional units (e.g., herein referred to as functional unit circuitry) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array) to execute instructions. Data can be moved from the memory array to registers external to the memory array via a bus.

DETAILED DESCRIPTION

Figure 1:
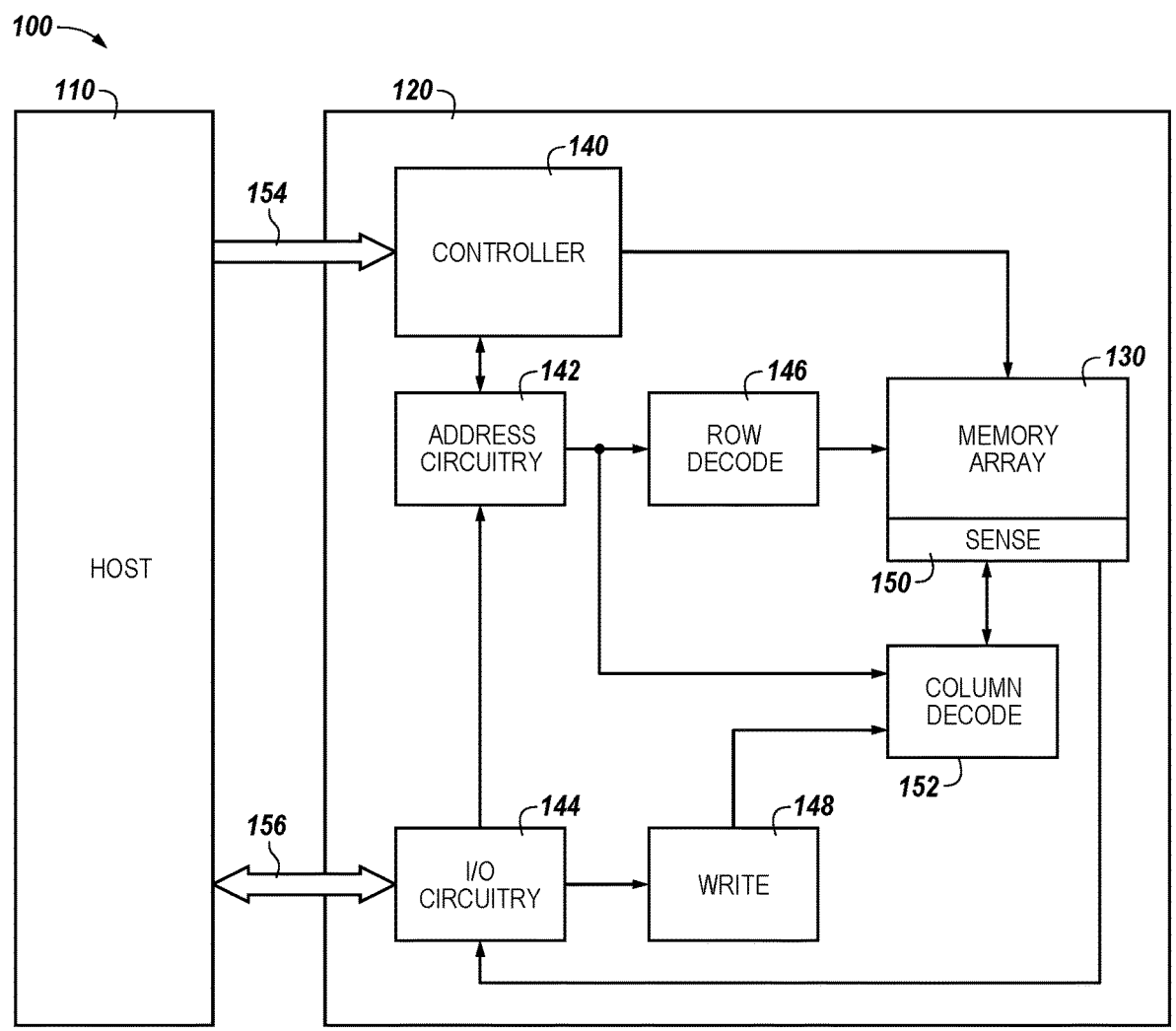
FIG. 1 is a block diagram of an apparatus in the form of a computing system in accordance with a number of embodiments of the present disclosure.

Examples of the present disclosure provide apparatuses and methods related to generating and executing a control flow. An example apparatus can include a first device configured to generate control flow instructions, and a second device including an array of memory cells, an execution unit to execute the control flow instructions, and a controller configured to control an execution of the control flow instructions on data stored in the array.

As used herein, a control flow refers to an order in which instructions (e.g., statements and/or function calls of a program) are executed. The order in which a number of instructions are executed can vary according to jumps, unconditional branches, conditional branches, loops, returns, and/or halts, among other instruction types associated with a program. In a number of examples, the number of instructions can also be function calls. An if-then statement is an example of a conditional branch. The condition evaluated in association with the if-then statement can be evaluated by a first device (e.g., a host processor) to generate a control flow. For example, a first set of instructions or a second set of instructions can be executed by a second device given the evaluation of a condition by the first device. The first device can further evaluate loops (e.g., for loops, while loops, etc.), for instance, to generate a number of instructions that are executed by a second device and an order associated with the number of instructions.

In various previous approaches, the control flow is generated and the instructions associated with the control flow are executed by a same device (e.g., a host processor). For example, the same device that generates a number of instructions and an order of execution associated with the instructions also executes the number of instructions according to the generated order. Generating the control flow and executing the instructions associated with the control flow in a same device can include generating the control flow before executing the instructions. For example, the control flow cannot be generated and the instructions executed at the same time if a single device is generating the control flow and executing the associated instructions.

In a number of examples according to the present disclosure, a first device can generate the control flow and a second device can execute the instructions corresponding to the control flow. For example, the control flow can be generated concurrently with the execution of the control flow. As used herein, instructions corresponding to a control flow, which may be referred to as "control flow instructions," are meant to refer to instructions that involve manipulating data. For instance, instructions that involve manipulating data include instructions involving performing computations on data, which can include mathematical operations (e.g., addition, subtraction, multiplication, and/or division), which can include performing various Boolean logic operations such as AND, OR, invert, etc. Examples of instructions that do not involve manipulating data include memory commands such as data read, data write, and data refresh operations.

As an example, the first device can be a host. A host can include one of a central processing unit (CPU), a system on a chip (SoC), and an application specific integrated circuitry (ASIC), for instance. As an example, a SoC can comprise one or more processors and one or more controllers (e.g., channel controllers) coupled to a number of memory devices. A second device can be a memory device including a memory array, an execution unit, which can comprise sensing circuitry that includes a number of compute components, and a controller that controls of the execution unit to execute the instructions. The controller of the memory device can operate the compute components of the execution unit to coordinate the execution of the instructions associated with the control flow.

As an example, the instructions generated by a host can be executed by performing a number of operations. For example, an "add" instruction includes performing various logical operations. As used herein, instructions and operations are used interchangeably. Operations can be compare operations, swap operations, and/or logical operations (e.g., AND operations, OR operations, SHIFT operations, INVERT operations etc.). However, embodiments are not limited to these examples. As used herein, executing Single Instruction Multiple Data (SIMD) operations is defined as performing a same operation on multiple elements in parallel (e.g., simultaneously). As used herein, an element is a numerical value that can be stored (e.g., as a bit-vector) in a memory array.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "J," "N," "R," "S," "U," "V," "W," and 'X' particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 in accordance with a number of embodiments of the present disclosure. As used herein, a host 110, a memory device 120, a memory array 130, and/or sensing circuitry 150 might also be separately considered an "apparatus" and/or a device.

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry) such as a CPU, SoC, ASIC, and/or memory buffer (e.g., registered dual in-line memory module (DIMN)). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIG. 6.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

As described further below, the controller 140 can comprise of multiple controllers (e.g., separate controller units). In a number of embodiments, the sensing circuitry 150 can comprise a number of sense amplifiers and a number of compute components, which may comprise an accumulator and can be used to perform logical operations (e.g., on data associated with complementary sense lines). In a number of embodiments, the sensing circuitry (e.g., 150) can be used to perform (e.g., execute) operations on data stored in array 130 and to store the results of the sort operation back to the array 130 without transferring data via a sense line address access (e.g., without firing a column decode signal) and/or without enabling a local I/O line coupled to the sensing circuitry. As such, operations can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)). In a number of embodiments the sensing circuitry 150 can be referred to as an execution unit. The execution unit may be coupled to the memory array 130 and/or may be decoupled from the memory array 130.

As such, in a number of embodiments, registers and/or an ALU external to array 130 and sensing circuitry 150 may not be needed to perform various operations as the sensing circuitry 150 can be controlled to perform the appropriate computations involved in performing operations using the address space of memory array 130. Additionally, operations can be performed without the use of an external processing resource. For instance, an external processing resource such as host 110 may generate a control flow, but the host 110 (e.g., an ALU of the host) may not be used to perform computations associated with executing the instructions corresponding to the control flow.

Figure 2:
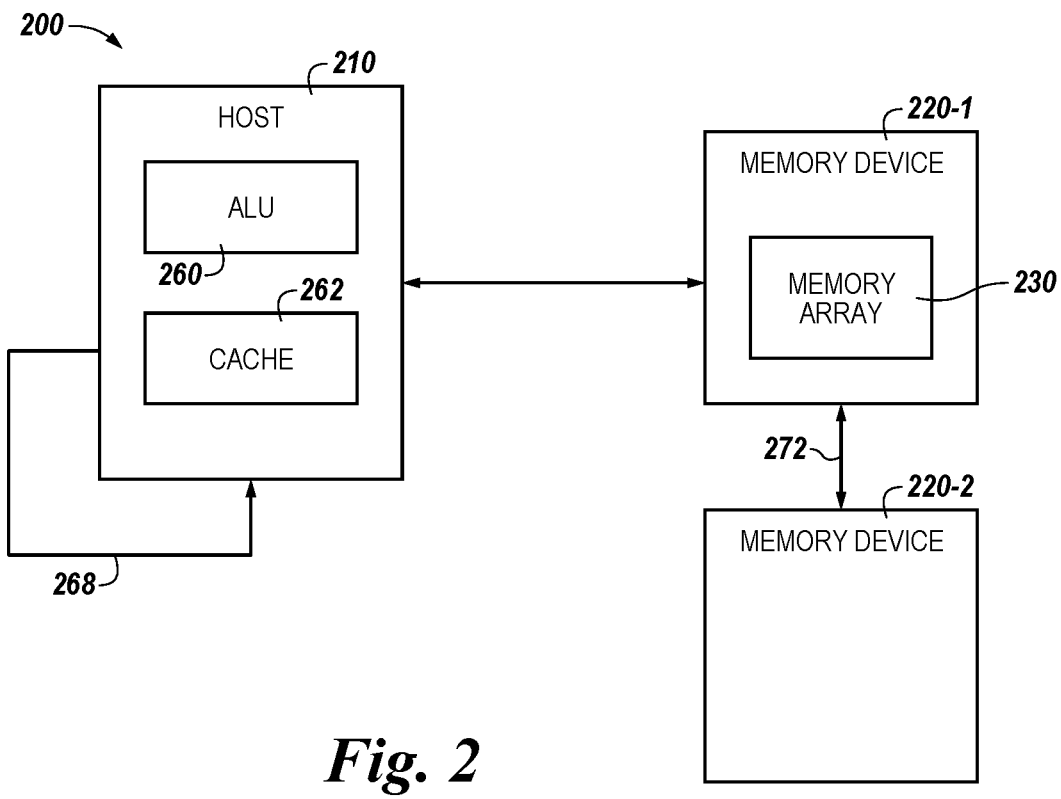
FIG. 2 is a block diagram of an apparatus in the form of a computing system in accordance with the prior art.

FIG. 2 is a block diagram of an apparatus in the form of a computing system 200 in accordance with the prior art. The system 200 includes a host 210, a memory device 220-1, and a memory device 220-2. The host 210 includes an ALU 260 and cache 262. Memory device 220-1 includes memory array 230.

As used herein, the host 210 is a first device and the memory device 220-1 is a second device. Memory device 220-1 and/or memory device 220-2 can be volatile memory and/or non-volatile memory. For example, memory device 220-1 can be a volatile memory (e.g., DRAM) and memory device 220-2 can be non-volatile memory (e.g., a hard drive, solid state drive (SSD), etc.).

In a number of previous approaches, the host 210 can request data from memory device 220-1. The memory device 220-1 can transfer the data stored in memory array 230 to the host 210. The memory device 220-1 can retrieve the data from memory device 220-2 (e.g., via a suitable interface represented by arrow 272) if memory device 220-1 does not have the requested data. The memory device 220-1 can store the data retrieved from memory device 220-2 in memory array 230. The data can be stored in cache 262 by the host 210. The data can be, for example, a set of executable instructions associated with performing a particular task (e.g., a program).

The ALU 260 can be used by the host 210 to identify the location of a number of instructions that need to be executed from the data stored in the cache 262. After each instruction is identified, by the ALU 260, the host 210 can execute the identified instruction (as indicated by arrow 268). For example, the host 210 can generate a control flow and can further execute the instructions associated with the control flow.

Figure 3:
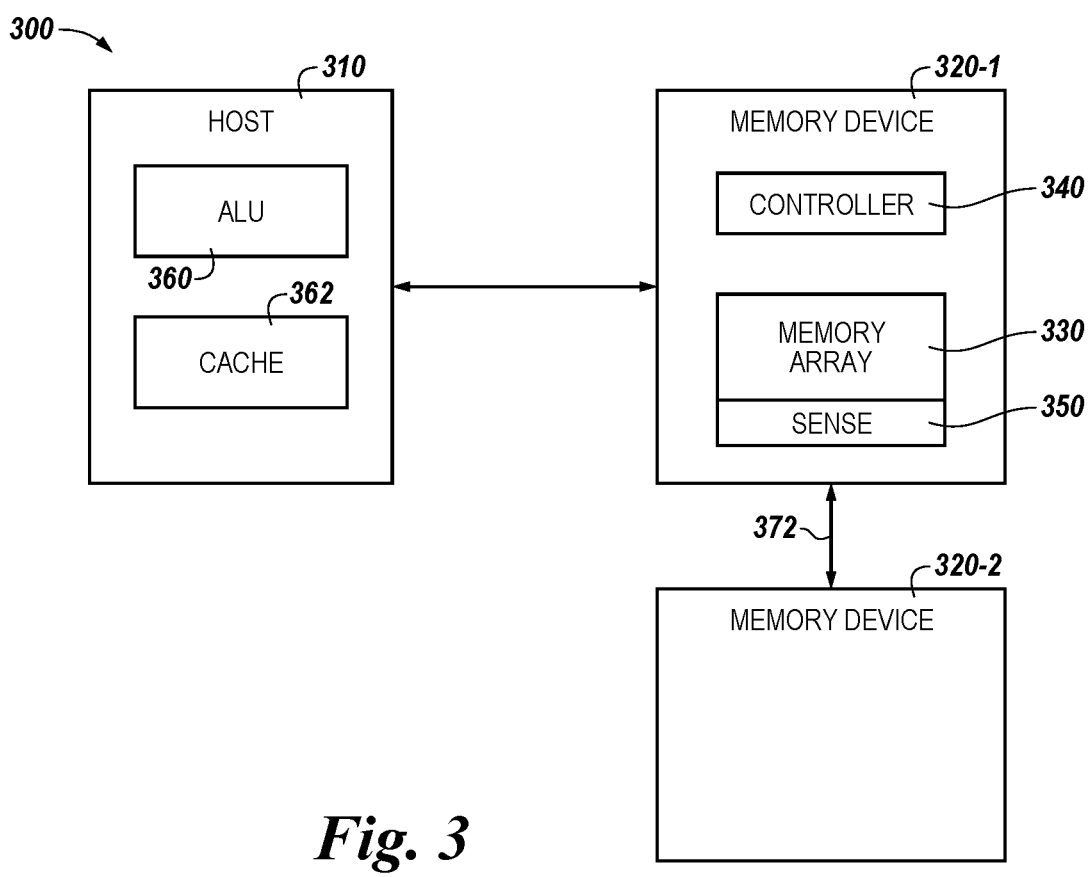
FIG. 3 is a block diagram of an apparatus in the form of a computing system in accordance with a number of embodiments of the present disclosure.

FIG. 3 is a block diagram of an apparatus in the form of a computing system 300 in accordance with a number of embodiments of the present disclosure. The system 300 includes a host 310, a memory device 320-1, and a memory device 320-2. In this example, the host 310 includes an ALU 360 and cache 362, and the memory device 320-1 includes a controller 340, memory array 330, and sensing circuitry 350.

The host 310 can be referred to as a first device and can comprise a CPU, SoC which may include a number of processors and a number of channel controllers (not shown), for example, and/or an ASIC, among other types of devices. The host 310 can be used to generate a control flow, which includes instructions and an execution order associated with the instructions. In a number of examples, the host 310 can utilize the ALU 360 to generate the control flow. Generating a control flow is further described in FIG. 5.

The host 310 can request data associated with a program from memory device 320-1. The memory device can retrieve the requested data from memory array 330. The memory device can return the data to host 310. The host can store the data in cache 362 and utilize the ALU 360 to generate a control flow. In a number of examples, the data can be data associated with a set of executable instructions (e.g., a program). The program can be represented in various formats. For example, the program can be represented as a source file, an assembly file, an object file, and/or an executable file. In a number of examples, the program can be generated dynamically. For example, the program can be provided via assembly file and/or a buffer.

Figure 5:
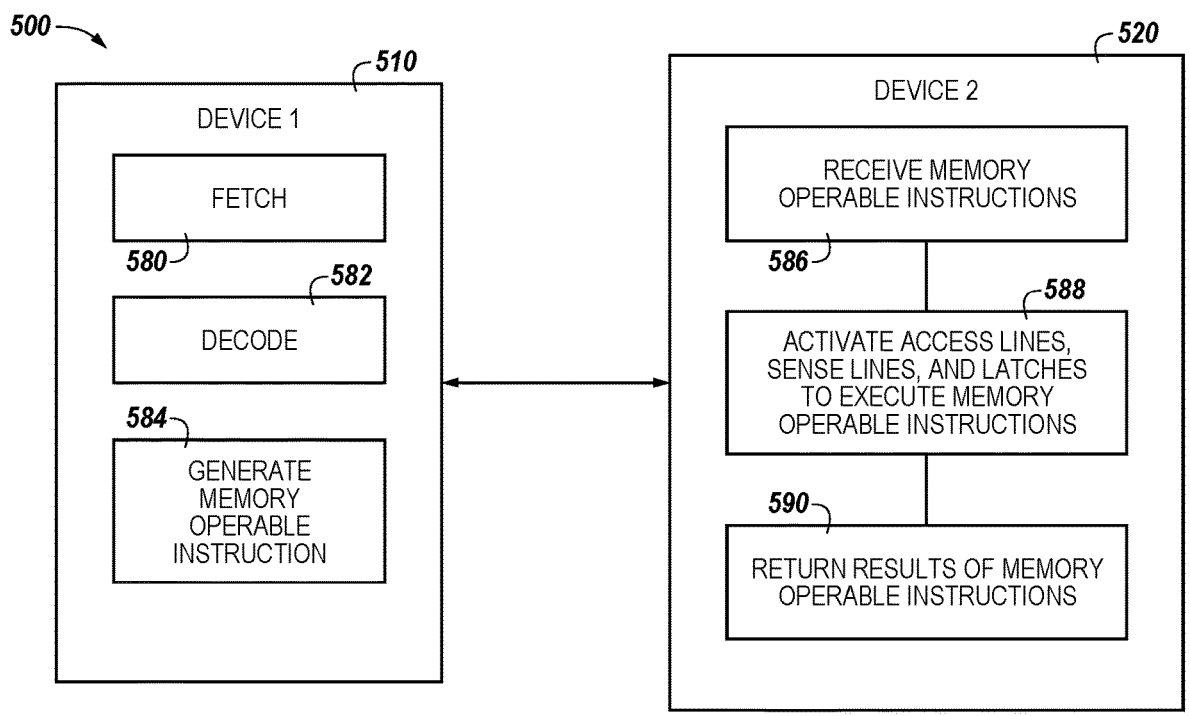
FIG. 5 is a block diagram of a control flow and the execution of the control flow in accordance with a number of embodiments of the present disclosure.

The data retrieved from memory array 330 can be used by host 310 to generate a control flow. For example, the ALU 360 can be used to retrieve a number of instructions that represent operations. FIG. 5 further describes the process of generating instructions.

In contrast to the example of FIG. 2, in which the control flow instructions generated by host 210 are executed on the host 210 (e.g., as indicated by arrow 268), in the example shown in FIG. 3, the host 310 can provide the control flow instructions and an order of execution associated with the instructions to the memory device 320-1 for execution on the device 320-1 (e.g., via an execution unit local to device 320-1). For example, although host 310 includes an ALU 360, which may be configured to execute control flow instructions generated by host 310, in a number of embodiments, the execution of the control flow instructions generated by host 310 occurs on a separate device (e.g., memory device 320-1). As an example, the memory device 320-1 can receive the control flow instructions from the host 310 at controller 340. The controller 340 can receive the instructions via a buffer, a memory array, and/or shift circuitry of memory device 320-1, for instance.

The controller 340 can control execution of the control flow instructions on data stored in memory cells in the memory array 330. For example, the controller 340 can control the execution of the instructions by controlling the sensing circuitry 350, which may serve as an execution unit, to perform a number of operations associated with the control flow instructions. In contrast, the memory device 220-1 shown in FIG. 2 may have a controller (not shown); however, such a controller would control execution of instructions other than command flow instructions. For example, a controller on device 220-1 might control execution of memory command operations such as data read, data write, and data refresh operations, which do not involve manipulation of data associated with computations, but would not control execution of command flow instructions.

Control flow instructions can include a number of operations including AND operations, OR operations, INVERT operations, and/or SHIFT operations. The number of operations can include other operations. For example the operations can be any number of binary operations and non-binary operations such as an addition operation, a multiplication operation, and/or a comparison operation. In a number of examples, the number of operations can be performed without transferring data via an input/output (I/O) line 634 in FIG. 6.

Figure 6:
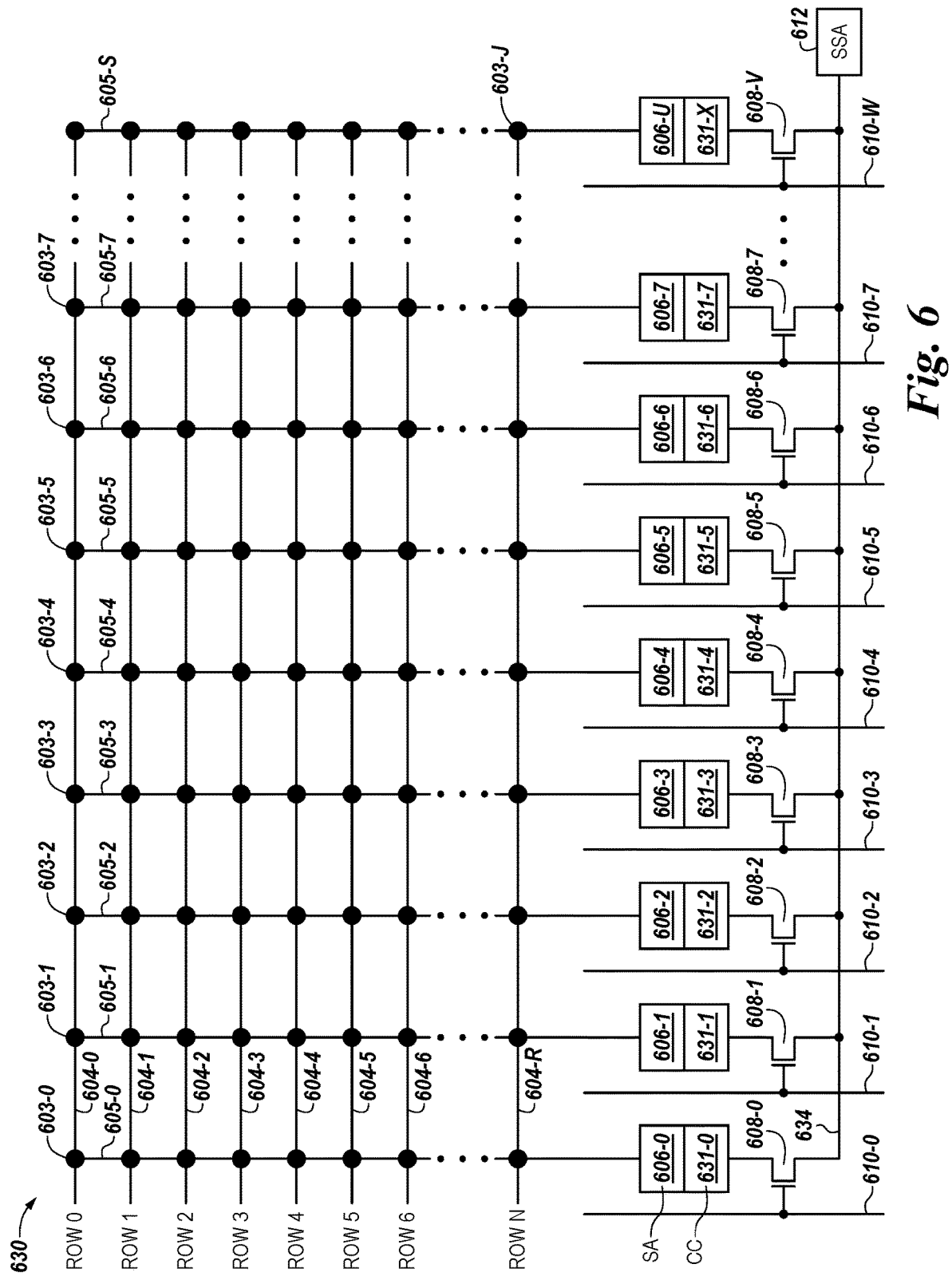
FIG. 6 illustrates a schematic diagram of a portion of a memory array in accordance with a number of embodiments of the present disclosure.

The controller 340 can control a plurality of compute components (e.g., compute components 631-0, 631-1, 631-2, 631-3, 631-4, 631-5, 631-6, 631-7, . . . , 631-X in FIG. 6, referred to generally as compute components 631) coupled to a plurality of sense lines (e.g., sense lines 605-0, 605-1, 605-2, 605-3, 605-4, 605-5, 605-6, 605-7, . . . , 605-S in FIG. 6, referred to generally as sense lines 605) and formed on pitch with the plurality of memory cells (e.g., memory cells 603-0, 603-1, 603-2, 603-3, 603-4, 603-5, 603-6, . . . , 603-J in FIG. 6, referred to generally as memory cells 603) in array 330. The controller 340 can also control a plurality of sense amplifiers (e.g., sense amplifiers 606-0, 606-1, 606-2, 606-3, 606-4, 606-5, 606-6, 606-7, . . . , 606-U in FIG. 6, referred to generally as sense amplifiers 606) coupled to the plurality of compute components 631. The controller 340 can control the compute components 631 and the sense amplifiers 606 to execute the instructions.

For example, the controller 340 can activate a number of sense lines 605 and access lines (e.g., access lines 604-0, 606-1, 606-2, 606-3, 606-4, 606-5, 606-6, . . . , 606-R in FIG. 6, referred to generally as access lines 604) in array 330 to read the data in the array 330. The data can be stored in the sense amplifiers 606 and/or the compute components 631. The controller 340 can further activate the sense lines 605, access lines 604, and/or latches associated with the compute components 631 and/or sense amplifiers 606 to execute a number of operations on the data stored in the sense lines 605 and/or the compute components 631.

The controller 340 can also activate the sense lines 605 and/or the access lines 604 to store the results of the operations (e.g., the results of the execution of the number of instructions) back to the array 330. In a number of examples, the controller 340 can further transfer the results of the operations and/or an indication that the operations have been executed back to host 310.

In a number of examples, the controller 340 can comprise a number of controllers. For example, the controller 340 can comprise a first controller and a number of second controllers. The first controller can receive the number of instructions from the host 310. The instructions can include instructions to perform, for example, an addition operation. The first controller can translate the number of instructions into a number of AND operations, OR operations, INVERT operations, and/or SHIFT operations, for example. The first controller can provide the AND operations, OR operations, INVERT operations, and/or SHIFT operations to the number of second controllers. The number of second controllers can control the compute components 631 and the sense amplifiers 606 to execute the AND operations, OR operations, INVERT operations, and/or SHIFT operations. For example, the number of second controllers can activate the sense lines 605, access lines 604, and/or latches associated with the compute components 631 and/or sense amplifiers 606 to execute the AND operations, OR operations, INVERT operations, and/or SHIFT operations. In a number of examples, each of the number of second controllers can control the compute components 631 and/or the sense amplifiers 606 to execute at least one of the AND operations, OR operations, INVERT operations, and/or SHIFT operations.

In accordance with a number of embodiments, a device on which a control flow is generated (e.g., host 310) can be independent from a device on which the corresponding control flow instructions are executed (memory device 320-1). As an example, a control flow can be generated in a number of portions. For instance, the host 310 can generate a control flow that includes a first portion and a second portion, with the first portion comprising a first number of control flow instructions and the second portion comprising a second number of control flow instructions. As an example, the host 310 can generate a first number of instructions that are associated with the first portion of the control flow and provide them to the memory device 320-1. The host 310 can generate the second number of instructions that are associated with the second portion of the control flow while the execution of the first number of instructions is occurring on the memory device 320-1 (e.g., the generation of the second portion of the control flow can occur concurrently with execution of the first portion of the control flow). The memory device 320-1 can return a result of the execution of the first number of instructions to the host 310 and the host 310 can provide the second number of instructions to the memory device 320-1. The memory device 320-1 can provide the result of the execution of the second number of instructions and/or an indication that the second number of instructions have been executed to the host 310.

Separating the creation of the control flow from the execution of the control flow provides the ability to execute the control flow concurrently with the creation of the control flow. Furthermore, separating the creation of the control flow from the execution of the control flow eliminates the need to move data to be operated on in association with the execution of the control flow to a host 310, since the control flow instructions are executed via an execution unit on a device (e.g., 320-1) separate from the host 310.

Figure 4:
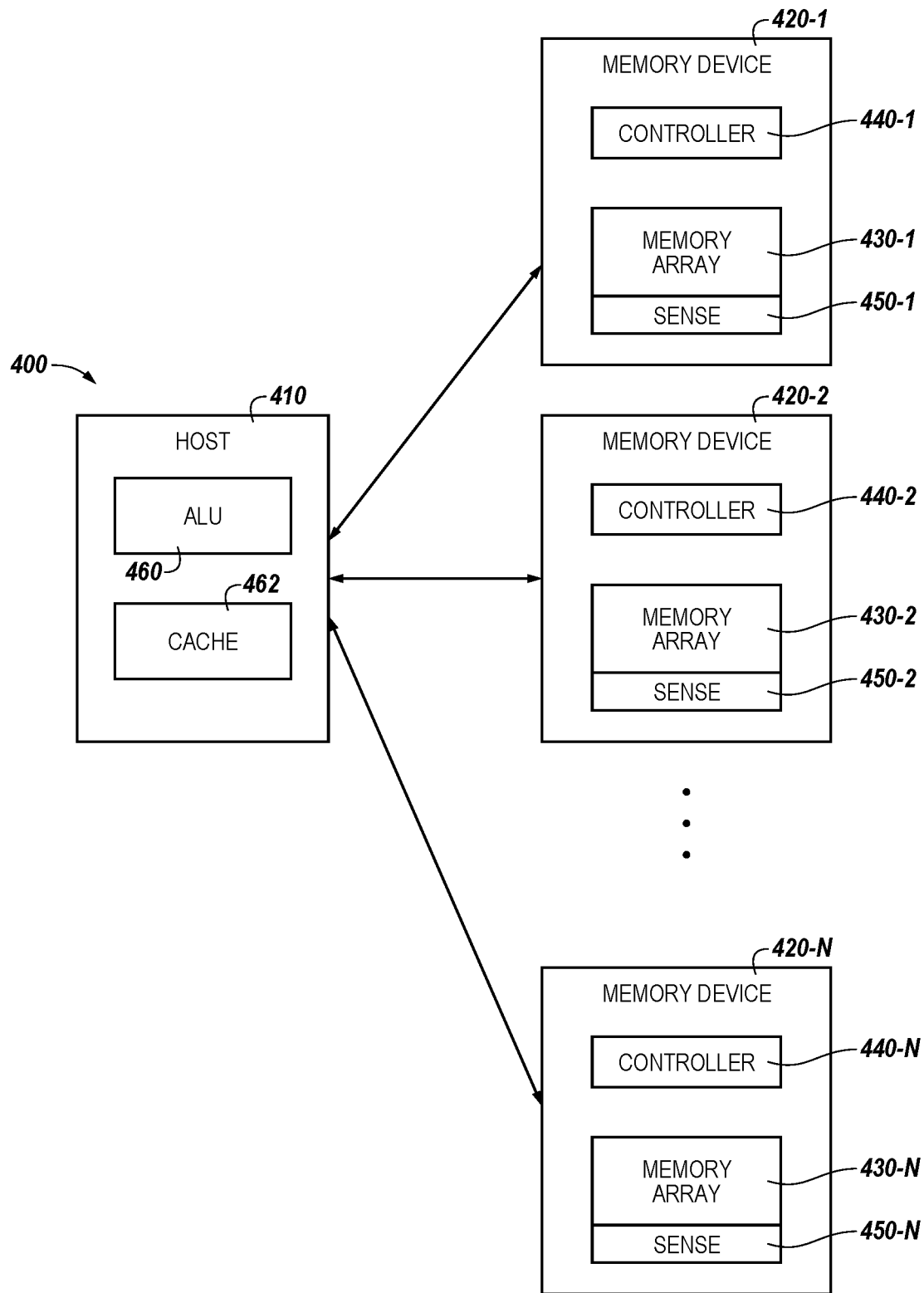
FIG. 4 is a block diagram of an apparatus in the form of a computing system in accordance with a number of embodiments of the present disclosure.

FIG. 4 is a block diagram of an apparatus in the form of a computing system in accordance with a number of embodiments of the present disclosure. System 400 includes a host 410 that can be analogous to host 310 in FIG. 3. FIG. 4 also includes memory devices 420-1, 420-2, . . . , 420-N (e.g., referred to generally as memory devices 420), which can be analogous to memory device 320.

In this example, each of the memory devices 420 includes a controller, a memory array, and sense circuitry. For example, memory device 420-1 includes controller 440-1, memory array 430-1, and sense circuitry 450-1, memory device 420-2 includes controller 440-2, memory array 430-2, and sense circuitry 450-2, and memory device 420-N includes controller 440-N, memory array 430-N, and sense circuitry 450-N. The controller 440-1, the controller 440-2, . . . , and the controller 440-N are referred to generally as controllers 440. The array 430-1, the array 430-2, . . . , and the array 430-N are referred to generally as arrays 430. The sense circuitry 450-1, the sense circuitry 450-2, . . . , and the sense circuitry 450-N are referred to generally as sense circuitry 450. As described further below, in a number of embodiments, the sense circuitry 450 can be operated (e.g., by a corresponding controller 440) to serve as an execution unit.

Host 410 can generate a number of different control flows. Each of the control flows can be associated with a particular memory device 420. For example, a first control flow can be associated with memory device 420-1, a second control flow can be associated with memory device 420-2, . . . , and an Nth control flow can be associated with memory device 420-N. Arrows from host 410 to devices 420-1 to 420-N represent an interface (e.g., bus) over which data, addresses, and/or commands can be transferred. However, the devices 420 may be coupled to the host 410 via a common bus, for instance.

As an example, each of the different control flows can be associated with a single (e.g., same) program and/or the different control flows can be associated with a different programs. For example, the first and second control flow can be associated with a first program and the Nth control flow can be associated with a second (e.g., different) program. The first control flow can be associated with a first portion of the first program that is independent from a second portion of the first program. The second control flow can be associated with a second portion of the first program that is independent from the first portion of the first program. A first portion of a program can be considered as being independent from a second portion of a program if executing a number of instructions associated with the first portion does not have an impact on the execution of a second number of instructions associated with the second portion of the program.

Each of the memory devices 420 can execute different instructions from a plurality of instructions associated with the plurality of control flows. For example, the memory device 420-1 can execute a first number of instructions associated with the first control flow, the memory device 420-2 can execute a second number of instructions associated with the second control flow, . . . , and the memory device 420-N can execute an Nth number of instructions associated with the Nth control flow.

In contrast to the example of FIG. 2, in which the creation of a control flow and execution of the corresponding control flow instructions occur on the same device, embodiments of the present disclosure can involve separating the creation of the control flows and the execution of the control flows, which can allow a number of processes to be executed concurrently. As used herein, a process refers to an instance of a program that is being executed. For example, a process can be executed concurrently with the execution of a second program.

Concurrent execution of a number of processes can include a host 410 generating control flows while the memory devices 420 are executing the control flows. For example, host 410 can generate a first control flow. The host 410 can provide the first control flow to memory device 420-1. The host 410 can generate a second control flow while the memory device 420-1 is executing a first number of instructions associated with the first control flow via the controller 440-1, the memory array 430-1, and the sense circuitry 450-1. The host 410 can provide the second control flow to memory device 420-2 while the memory device 420-1 is executing the first number of instructions associated with the first control flow. The host 410 can generate and provide an Nth control flow to the memory device 420-N while the memory device 420-1 and the memory device 420-2 are executing the first number of instructions associated with the first control flow and the second number of instructions associated with the second control flow, respectively. The memory device 420-2 can execute the second number of instructions via the controller 440-2, the memory array 430-2, and the sense circuitry 450-2. Each of the memory devices 420 can execute a different plurality of instructions associated with different control flows concurrently. For example, the memory device 410-2 can execute the first number of instructions, the memory device 410-2 can execute the second number of instructions, and the memory device 410-N can execute the Nth number of instructions concurrently. The memory device 410-N can execute the Nth number of instructions via the controller 440-N, the memory array 430-N, and the sense circuitry 450-N.

Each of the memory devices 420 can return a result of the execution of the different plurality of instructions and/or an indication that the different plurality of instructions have been executed. For example, the memory device 420-1 can inform the host 410 that the first number of instructions have been executed while the second number of instructions and the Nth number of instructions are being executed (e.g., on devices 420-2 and 420-N, respectively). The host 410 can generate a different control flow that is associated with the first control flow based on the result of the first number of instructions that are associated with the first control flow. The host 410 can provide the different control flow to the memory device 420-1 while the memory device 420-2 and the memory device 420-N are executing the second number of instructions and the Nth number of instructions, respectively. Each of the different control flows can be generated serially. For example, the second control flow can be generated after the first control flow is generated and the Nth control flow can be generated after the first control flow and the second control flow are generated. Each of a different number of instructions associated with the different control flows can be executed concurrently (e.g., at a same time). Each of the different number of instructions associated with the control flow can be executed concurrently with the creation of the different control flows.

The example of FIG. 4 provides the ability to generate a number of control flows and execute a number of control flows concurrently by separating the creation of the control flow from the execution of the control flow. Executing a number of control flows concurrently can increase productivity and can utilize a greater number of computational resources concurrently as opposed to executing a single control flow at a time as provided in the example of FIG. 2. As an example, the ALU 460 of host 410 can be configured to determine the manner in which control flows are generated and/or distributed among the devices 420 for execution.

FIG. 5 is a block diagram of a control flow and the execution of the control flow in accordance with a number of embodiments of the present disclosure. FIG. 5 illustrates a system 500 that includes a device 510 and a device 520. Generating a control flow can include fetching, decoding, and generating control flow instructions, which can include memory operable instructions. Executing the memory operable instructions includes receiving the memory operable instructions 586, operating an execution unit (e.g., by activating access lines, sense lines, and latches), and returning the result of the execution of the memory operable instructions.

In the example shown in FIG. 5, device 510 can be a host (e.g., host 410) configured to generate control flows, and device 520 can be a memory device (e.g., device 420) configured to execute at least some control flow instructions generated by the device 510. Fetching, decoding, and/or generating memory operable instructions can be classified as host operable instructions. Host operable instructions are instructions that a host (e.g., device 510) uses to create memory operable instructions. For example, the host operable instructions are instructions that the host uses to create a number of operations that are executed by device 520. Memory operable instructions are further described below.

As described above the device 510 can be a host and the device 520 can be a memory device. Host 510 can be associated with a program counter. The program counter holds the memory address of the next instruction to be executed. The program counter can be incremented to get the address of the next instructions.

At 580, the device 510 fetches an instruction from memory using the program counter. At the end of the fetch operation the program counter can point to the next instruction that will be read at the next cycle. The device 510 can store the fetched instruction in a cache. Cache can be, for example, an instruction register and/or another form of memory.

At 582, the device 510 decodes the fetched instruction. Decoding the fetched instruction can include determining an operation to be performed based on op-code associated with the fetched instruction. For example, the device 510 can decode an instruction (e.g., fetched instruction) to determine that an addition operation is to be performed.

At 584, the device 510 generates memory operable instructions. Generating memory operable instructions can include dynamically generating memory operable instructions. Dynamically generating memory operable instructions can be synonymous with dynamically generating a control flow because the memory operable instructions can be control flow instructions that are associated with a control flow. The memory operable instructions can be dynamically generated when the device 510 evaluates the decoded instructions to generate the memory operable instructions. The device 510 can dynamically generate memory operable instructions by evaluating a decoded instruction to generate the memory operable instructions. For example, a decoded instruction can be an if-then statement. The if-then statement can be dynamically evaluated by the device 510. The device 510 can dynamically select a first memory operable instruction instead of a second memory operable instruction based on the evaluation of the if-then statement. In a number of examples, the memory operable instructions can be dynamically generated after a program has been compiled.

As used herein, memory operable instructions refers to instructions that are to be executed by the device 520. Memory operable instructions can include logical operations (e.g., AND operation, OR operations, etc.), addition operations, subtraction operations, multiplication operations, division operations, and/or comparison operations among other types of operations that can be associated with control flow instructions. Furthermore, memory operable instructions can include read operations and/or write operations (e.g., memory commands that do not involve manipulating data).

A plurality of memory operable instructions can be generated or a single memory operable instruction can be generated by device 510. At 586, the device 520 can receive the memory operable instructions. The memory operable instructions can be received at a controller (e.g., controller 340). At 588, the device 520 can activate access lines, sense lines, and/or latches to execute the memory operable instructions. For example, the controller can activate a number of access lines, sense lines, and/or latches associated with a memory array and/or sense circuitry in device 520. Activating the number of access lines, sense lines, and/or latches can move data from array in to the sensing circuitry.

The controller can further activate access lines, sense lines, and/or latches in sense circuitry to execute the memory operable instructions on the data stored in the sensing circuitry. In a number of examples, the result of the execution of the memory operable instructions can be stored back to the array. At 590, the result of the memory operable instructions can be returned to device 510.

In a number of examples, the device 510 and the device 520 at least partially decode the instructions. For example, the device 510 can partially decode an instruction to generate a memory operable instruction. The device 510 can provide the partially decoded memory operable instruction to the controller in device 520. The decoder can further decode the memory operable instruction and execute the fully decoded memory operable instruction.

In a number of examples, the device 510 can retain partial control over the memory operable instructions while the memory operable instructions are executed on device 520. The device 510 can retain partial control over the memory operable instructions by partially decoding the memory operable instructions. For example, the device 510 can partially decode memory operable instructions by translating a virtual address into a physical memory address and device 520 can retrieve an instruction from the translated physical memory address. The device 510 can retain partial control over the memory operable instructions by translating the virtual address into the physical memory address.

FIG. 6 illustrates a schematic diagram of a portion of a memory array 630 in accordance with a number of embodiments of the present disclosure. The array 630 includes memory cells 603-0, 603-1, 603-3, 603-4, 603-5, 603-6, 603-7, 603-8, . . . , 603-J (e.g., referred to generally as memory cells 603), coupled to rows of access lines 604-0, 604-1, 604-2, 604-3, 604-4, 604-5, 604-6, . . . , 604-R and columns of sense lines 605-0, 605-1, 605-2, 605-3, 605-4, 605-5, 605-6, 605-7, . . . , 605-S, which may be referred to generally as access lines 604 and sense lines 605. Memory array 630 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense. The array 630 can be an array such as array 330 in FIG. 3 or array 430 in FIG. 4, for example.

Each column of memory cells can be coupled to sensing circuitry (e.g., sensing circuitry 150 shown in FIG. 1). In this example, the sensing circuitry comprises a number of sense amplifiers 606-0, 606-1, 606-2, 606-3, 606-4, 606-5, 606-6, 606-7, . . . , 606-U (e.g., referred to generally as sense amplifiers 606) coupled to the respective sense lines 605-0,

605-1, 605-2, 605-3, 605-4, 605-5, 605-6, 605-7, . . . , 605-S. The sense amplifiers 606 are coupled to input/output (I/O) line 634 (e.g., a local I/O line) via access devices (e.g., transistors) 608-0, 608-2, 608-3, 608-4, 608-5, 608-6, 608-7, . . . , 608-V. In this example, the sensing circuitry also comprises a number of compute components 631-0, 631-2, 631-3, 631-4, 631-5, 631-6, 631-7, . . . , 631-X (e.g., referred to generally as compute components 631) coupled to the respective sense lines. Column decode lines 610-0 to 610-W are coupled to the gates of transistors 608-0 to 608-V, respectively, and can be selectively activated to transfer data sensed by respective sense amplifiers 606-0 to 606-U and/or stored in respective compute components 631-0 to 631-X to a secondary sense amplifier 612 and/or to processing resources external to array 630 (e.g., via I/O line 634). In a number of embodiments, the compute components 631 can be formed on pitch with the memory cells of their corresponding columns and/or with the corresponding sense amplifiers 606.

The sensing circuitry (e.g., compute components 631 and sense amplifiers 606) can be controlled by the controller (e.g., 140, 340, and 440) to execute control flow operations in accordance with a number of embodiments described herein. The example described in association with FIGS. 3 to 5, demonstrate how operations can be performed on data (e.g., elements) stored in an array such as array 630.

Figure 7:
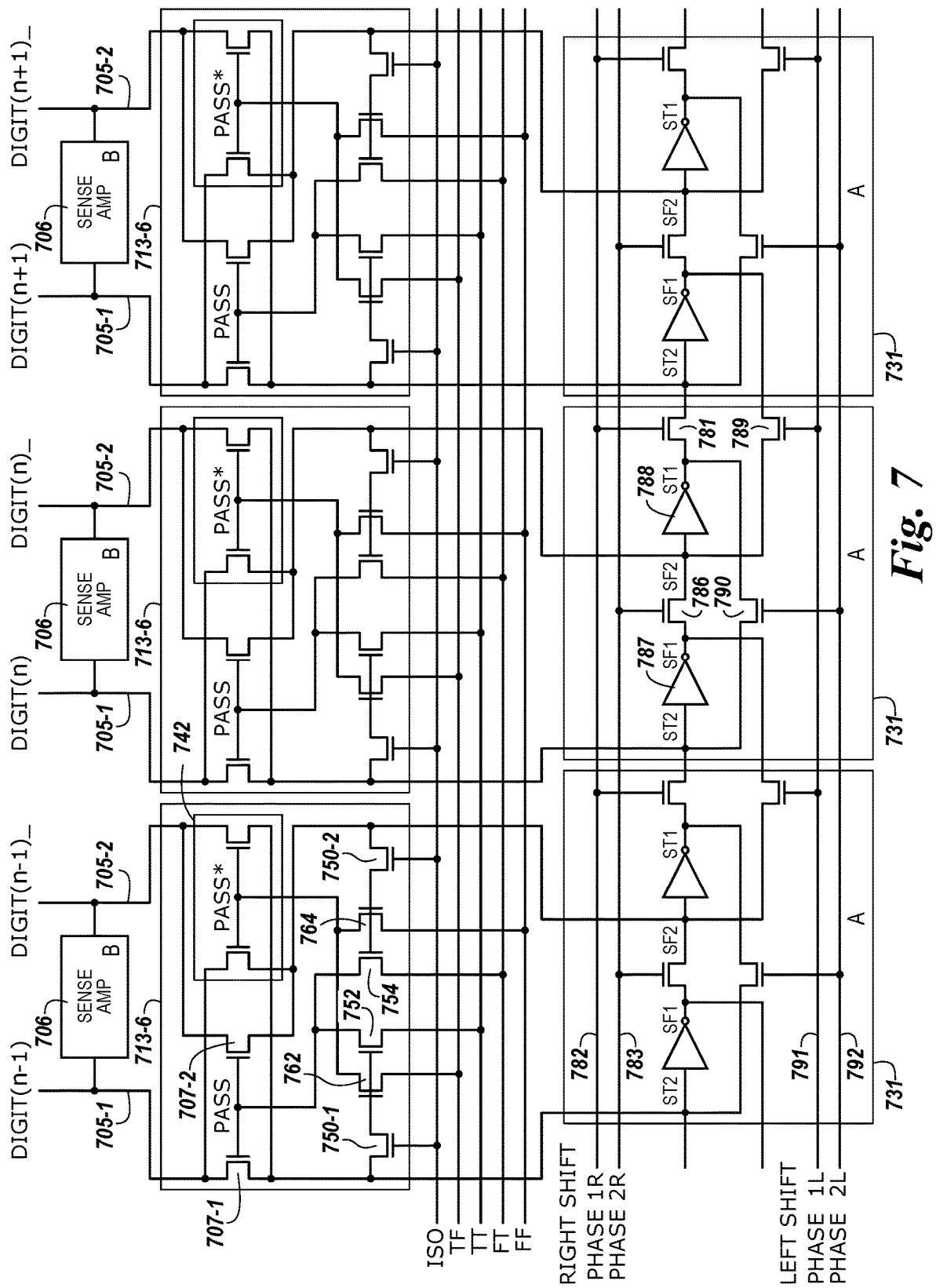
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a number of sense amplifiers 706 coupled to respective pairs of complementary sense lines 705-1 and 705-2, and a corresponding number of compute components 731 coupled to the sense amplifiers 706 via pass gates 707-1 and 707-2. The gates of the pass gates 707-1 and 707-2 can be controlled by a logical operation selection logic signal, PASS. For example, an output of the logical operation selection logic 713-6 can be coupled to the gates of the pass gates 707-1 and 707-2.

According to the embodiment illustrated in FIG. 7, the compute components 731 can comprise respective stages (e.g., shift cells) of a loadable shift register configured to shift data values left and right For example, as illustrated in FIG. 7, each compute component 731 (e.g., stage) of the shift register comprises a pair of right-shift transistors 781 and 786, a pair of left-shift transistors 789 and 790, and a pair of inverters 787 and 788. The signals PHASE 1R, PHASE 2R, PHASE 1L, and PHASE 2L can be applied to respective control lines 782, 783, 791 and 792 to enable/disable feedback on the latches of the corresponding compute components 831 in association with performing logical operations and/or shifting data in accordance with embodiments described herein. Examples of shifting data (e.g., from a particular compute component 731 to an adjacent compute component 731) is described further below with respect to FIG. 9.

The logical operation selection logic 713-6 includes the swap gates 742, as well as logic to control the pass gates 707-1 and 707-2 and the swap gates 742. The logical operation selection logic 713-6 includes four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line.

Figure 9:
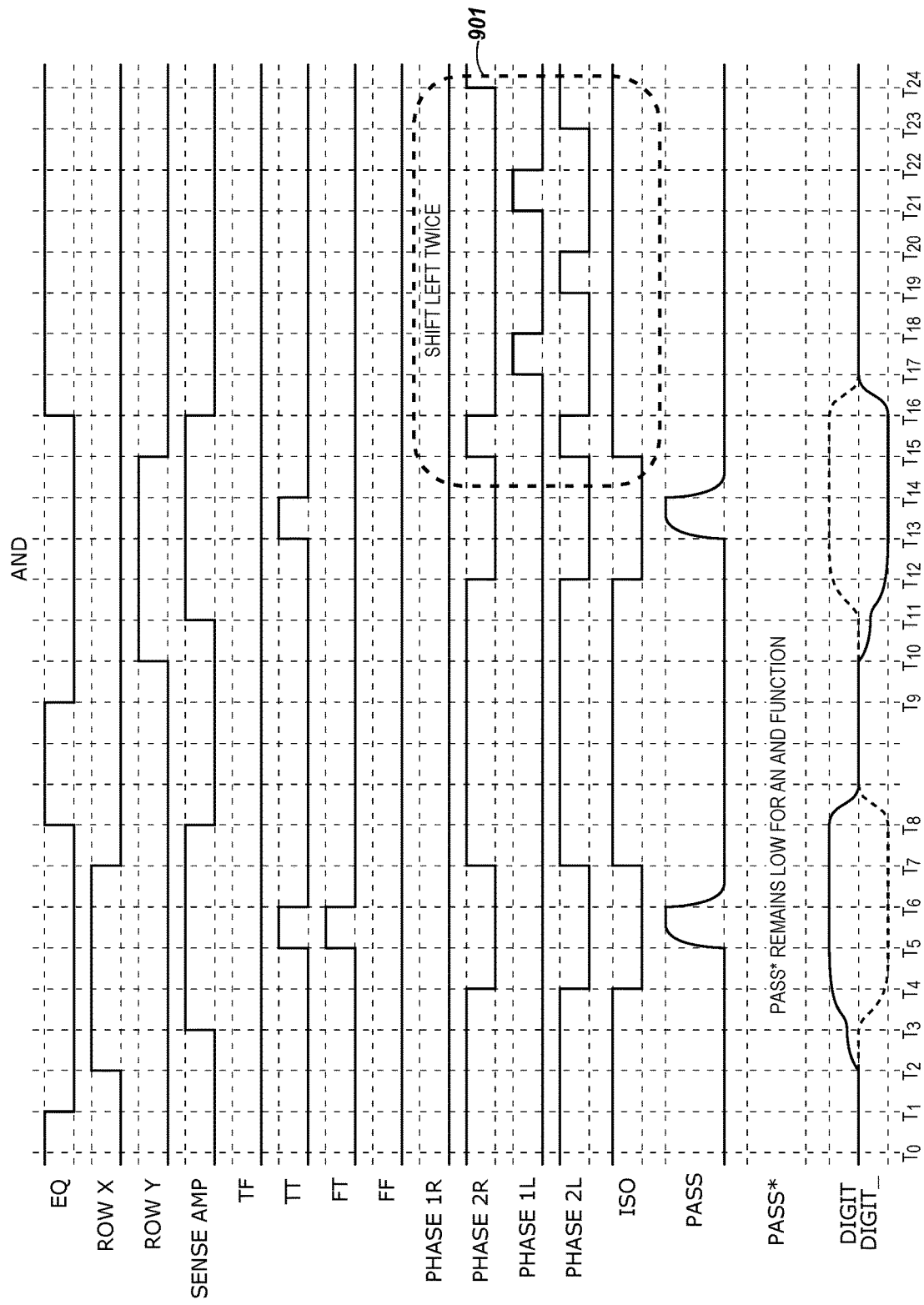
FIG. 9 illustrates a timing diagram associated with performing a logical operation and a shifting operation using sensing circuitry in accordance with a number of embodiments of the present disclosure.

Gates of logic selection transistors 762 and 752 are coupled to the true sense line through isolation transistor 750-1 (having a gate coupled to an ISO signal control line). Gates of logic selection transistors 764 and 754 are coupled to the complementary sense line through isolation transistor 750-2 (also having a gate coupled to an ISO signal control line). FIG. 9 illustrate timing diagrams associated with performing logical operations and shifting operations using the sensing circuitry shown in FIG. 7.

Figure 8:
FIG. 8 is a logic table illustrating selectable logic operation results implemented by a sensing circuitry in accordance with a number of embodiments of the present disclosure.

FIG. 8 is a logic table illustrating selectable logic operation results implemented by a sensing circuitry (e.g., sensing circuitry shown in FIG. 7) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 706 and compute component 731. The four control signals (e.g., TF, TT, FT, and FF), in conjunction with a particular data value present on the complementary sense lines (e.g., on nodes S and S*), controls the pass gates 707-1 and 707-2 and swap transistors 742, which in turn affects the data value in the compute component 731 and/or sense amplifier 706 before/after firing. The capability to selectably control the swap transistors 742 facilitates implementing logical operations involving inverse data values (e.g., inverse operands and/or inverse result), among others.

Logic Table 8-1 illustrated in FIG. 8 shows the starting data value stored in the compute component 731 shown in column A at 844, and the starting data value stored in the sense amplifier 706 shown in column B at 845. The other 3 column headings in Logic Table 8-1 refer to the state of the pass gates 707-1 and 707-2 and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2 when the ISO control signal is asserted. The "NOT OPEN" column corresponds to the pass gates 707-1 and 707-2 and the swap transistors 742 both being in a non-conducting condition, the "OPEN TRUE" column corresponds to the pass gates 707-1 and 707-2 being in a conducting condition, and the "OPEN INVERT" column corresponds to the swap transistors 742 being in a conducting condition. The configuration corresponding to the pass gates 707-1 and 707-2 and the swap transistors 742 both being in a conducting condition is not reflected in Logic Table 8-1 since this results in the sense lines being shorted together.

Via selective control of the pass gates 707-1 and 707-2 and the swap transistors 742, each of the three columns of the upper portion of Logic Table 8-1 can be combined with each of the three columns of the lower portion of Logic Table 8-1 to provide nine (e.g., 3×3) different result combinations, corresponding to nine different logical operations, as indicated by the various connecting paths shown at 875. The nine different selectable logical operations that can be implemented by the sensing circuitry 750 are summarized in Logic Table 8-2.

The columns of Logic Table 8-2 show a heading 880 that includes the states of logic selection control signals (e.g., FF, FT, TF, TT). For example, the state of a first logic selection control signal (e.g., FF) is provided in row 876, the state of a second logic selection control signal (e.g., FT) is provided in row 877, the state of a third logic selection control signal (e.g., TF) is provided in row 878, and the state of a fourth logic selection control signal (e.g., TT) is provided in row 879. The particular logical operation corresponding to the results is summarized in row 847.

FIG. 9 illustrates a timing diagram associated with performing a logical AND operation and a shifting operation using the sensing circuitry in accordance with a number of embodiments of the present disclosure. FIG. 9 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal (not shown) associated with a sense amplifier (e.g., sense amplifier 706). The ROW X and ROW Y signals correspond to signals applied to respective access line (e.g., access lines ROW 1 and ROW 2 shown in FIG. 6) to access a selected cell (or row of cells). The SENSE AMP signal corresponds to a signal used to enable/disable a sense amplifier (e.g., sense amplifier 706). The TF, TT, FT, and FF signals correspond to logic selection control signals such as those shown in FIG. 7 (e.g., signals coupled to logic selection transistors 762, 752, 754, and 764). The PHASE 1R, PHASE 2R, PHASE 1L, and PHASE 2L signals correspond to the control signals (e.g., clock signals) provided to respective control lines 782, 783, 791 and 792 shown in FIG. 7. The ISO signal corresponds to the signal coupled to the gates of the isolation transistors 750-1 and 750-2 shown in FIG. 7. The PASS signal corresponds to the signal coupled to the gates of pass transistors 707-1 and 707-2 shown in FIG. 7, and the PASS* signal corresponds to the signal coupled to the gates of the swap transistors 742. The DIGIT and DIGIT_signals correspond to the signals present on the respective sense lines 705-1 (e.g., DIGIT (n)) and 705-2 (e.g., DIGIT (n)_).

The timing diagram shown in FIG. 9 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 9, reference will be made to the sensing circuitry described in FIG. 7. For example, the logical operation described in FIG. 9 can include storing the data value of the ROW X memory cell (e.g., the "ROW X" data value) in the latch of the corresponding compute component 731 (e.g., the "A" data value), which can be referred to as the accumulator 731, storing the data value of the ROW Y memory cell (e.g., the "ROW Y" data value) in the latch of the corresponding sense amplifier 706 (e.g., the "B" data value), and performing a selected logical operation (e.g., a logical AND operation in this example) on the ROW X data value and the ROW Y data value, with the result of the selected logical operation being stored in the latch of the compute component 731.

As shown in FIG. 9, at time $T_1$, equilibration of the sense amplifier 706 is disabled (e.g., EQ goes low). At time $T_2$, ROW X goes high to access (e.g., select) the ROW X memory cell. At time $T_3$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW X data value (e.g., as shown by the DIGIT and DIGIT_signals), and the ROW X data value is latched in the sense amplifier 706. At time $T_4$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time $T_4$, ISO goes low, which disables isolation transistors 750-1 and 750-2. At time $T_5$, TT and FT are enabled (e.g., go high), which results in PASS going high (e.g., since either transistor 752 or 754 will conduct depending on which of node ST2 or node SF2 was high when ISO was disabled at time $T_4$ (recall that when ISO is disabled, the voltages of the nodes ST2 and SF2 reside dynamically on the gates of the respective enable transistors 752 and 754). PASS going high enables the pass transistors 707-1 and 707-2 such that the DIGIT and DIGIT_signals, which correspond to the ROW X data value, are provided to the respective compute component nodes ST2 and SF2. At time $T_6$, TT and FT are disabled, which results in PASS going low, which disables the pass transistors 707-1 and 707-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 731 such that the ROW X data value is latched therein. Enabling ISO at time $T_7$ again couples nodes ST2 and SF2 to the gates of the enable transistors 752, 754, 762, and 764. At time $T_8$, equilibration is enabled (e.g., EQ goes high such that DIGIT and DIGI-T_are driven to an equilibrate voltage such as $V_{DD}/2$) and the sense amplifier 706 is disabled (e.g., SENSE AMP goes low).

With the ROW X data value latched in the compute component 731, equilibration is disabled (e.g., EQ goes low at time $T_9$). At time $T_{10}$, ROW Y goes high to access (e.g., select) the ROW Y memory cell. At time $T_{11}$, the sense amplifier 706 is enabled (e.g., SENSE AMP goes high), which drives the complementary sense lines 705-1 and 705-2 to the appropriate rail voltages (e.g., $V_{DD}$ and GND) responsive to the ROW Y data value (e.g., as shown by the DIGIT and DIGIT_signals), and the ROW Y data value is latched in the sense amplifier 706. At time $T_{12}$, the PHASE 2R and PHASE 2L signals go low, which disables feedback on the latch of the compute component 731 (e.g., by turning off transistors 786 and 790, respectively) such that the value stored in the compute component may be overwritten during the logical operation. Also, at time $T_{12}$, ISO goes low, which disables isolation transistors 750-1 and 750-2. Since the desired logical operation in this example is an AND operation, at time $T_{13}$, TT is enabled while TF, FT and FF remain disabled (as shown in TABLE 8-2, FF=0, FT=0, TF=0, and TT=1 corresponds to a logical AND operation). Whether enabling TT results in PASS going high depends on the value stored in the compute component 731 when ISO is disabled at time $T_{12}$. For example, enable transistor 752 will conduct if node ST2 was high when ISO is disabled, and enable transistor will not conduct if node ST2 was low when ISO was disabled at time $T_{12}$.

In this example, if PASS goes high at time $T_{13}$, the pass transistors 707-1 and 707-2 are enabled such that the DIGIT and DIGIT_signals, which correspond to the ROW Y data value, are provided to the respective compute component nodes ST2 and SF2. As such, the value stored in the compute component 731 (e.g., the "ROW X" data value) may be flipped, depending on the value of DIGIT and DIGIT_(e.g., the 'ROW Y" data value). In this example, if PASS stays low at time $T_{13}$, the pass transistors 707-1 and 707-2 are not enabled such that the DIGIT and DIGIT_signals, which correspond to the ROW Y data value, remain isolated from the nodes ST2 and SF2 of the compute component 731. As such, the data value in the compute component (e.g., the ROW X data value) would remain the same.

At time $T_{14}$, TT is disabled, which results in PASS going (or remaining) low, such that the pass transistors 707-1 and 707-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 731 such that the result of the AND operation (e.g., "A" AND "B") is latched therein. Enabling ISO at time $T_{15}$ again couples nodes ST2 and SF2 to the gates of the enable transistors 752, 754, 762, and 764. At time $T_{16}$, equilibration is enabled (e.g., EQ goes high such that DIGIT and DIGIT_are driven to an equilibrate voltage) and the sense amplifier 706 is disabled (e.g., SENSE AMP goes low).

The result of the AND operation, which is initially stored in the compute component 731 in this example, can be transferred back to the memory array (e.g., to a memory cell coupled to ROW X, ROW Y, and/or a different row via the complementary sense lines) and/or to an external location (e.g., an external processing component) via I/O lines.

FIG. 9 also includes (e.g., at 901) signaling associated with shifting data (e.g., from a compute component 731 to an adjacent compute component 731). The example shown in FIG. 9 illustrates two left shifts such that a data value stored in a compute component corresponding to column "N" is shifted left to a compute component corresponding to column "N-2". As shown at time $T_{16}$, PHASE 2R and PHASE 2L are disabled, which disables feedback on the compute component latches, as described above. To perform a first left shift, PHASE 1L is enabled at time $T_{17}$ and disabled at time Tis. Enabling PHASE 1L causes transistor 789 to conduct, which causes the data value at node SF1 to move left to node SF2 of a left-adjacent compute component 731. PHASE 2L is subsequently enabled at time $T_{19}$ and disabled at time $T_{20}$. Enabling PHASE 2L causes transistor 790 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A processor in memory (PIM) apparatus comprising:
    a memory device configured to receive a first plurality of mathematical operations of first control flow instructions and a second plurality of mathematical operations of second control flow instructions generated by a host, including:
        a first array of memory cells;
        a second array of memory cells;
        a first execution unit, coupled to the first array, to execute the first control flow instructions;
        a second execution unit, coupled to the second array, to execute the second control flow instructions;
        a first controller configured to control an execution of the first control flow instructions on data stored in the first array using the first execution unit; and
        a second controller configured to control an execution of the second control flow instructions on data stored in the second array using the second execution unit.

2. The PIM apparatus of claim 1, wherein the first plurality of mathematical operations and the second plurality of mathematical operations include instructions for manipulating data using the first execution unit and the second execution unit.

3. The PIM apparatus of claim 1, wherein the first plurality of mathematical operations and the second plurality of mathematical operations include logical operations.

4. The PIM apparatus of claim 3, wherein the logical operations include Boolean logical operations.

5. The PIM apparatus of claim 1, wherein the first control flow instructions and the second control flow instructions include compare operations and swap operations.

6. The PIM apparatus of claim 1, wherein the first control flow instructions and the second control flow instructions include Single Instruction Multiple Data (SIMD) operations.

7. The PIM apparatus of claim 1, wherein the first control flow instructions and the second control flow instructions comprise a control flow generated by the memory device.

8. The PIM apparatus of claim 7, wherein the control flow includes an order in which the first control flow instructions and the second control flow instructions are executed.

9. The PIM apparatus of claim 7, wherein the first control flow instructions are associated with a first portion of the control flow and the second control flow instructions are associated with a second portion of the control flow.

10. The PIM apparatus of claim 7, wherein the second control flow instructions are generated by the host while the first execution unit executes the first control flow instructions.

11. A system for operating a process in memory (PIM) apparatus comprising:
    a host, configured to convert host operable instructions into op-code instructions to generate control flow instructions comprising a plurality of mathematical operations; and a memory device, including:
  an array of memory cells;
  an execution unit, coupled to the array, to execute the control flow instructions; and
  a controller configured to control an execution of the control flow instructions on data stored in the array.

12. The system of claim 11, wherein the host is further configured to fetch instructions from the memory device.

13. The system of claim 12, wherein the host is further configured to store the fetched instructions in a cache.

14. The system of claim 13, wherein the host is further configured to decode the fetched instructions stored in the cache.

15. The system of claim 14, wherein the host is further configured to determine the plurality of mathematical operations to be performed based on the op-code associated with the fetched instructions.

16. A system for operating a process in memory (PIM) apparatus comprising:
  a host configured to:
    decode host operable instructions; and
    dynamically generate memory operable instructions from the decoded host operable instructions; and
  a memory device, including:
    an array of memory cells;
    an execution unit, coupled to the array, to execute the memory operable instructions; and
    a controller configured to control an execution of the memory operable instructions on data stored in the array.

17. The system of claim 16, wherein the host is further configured to dynamically generate the memory operable instructions after a program that includes the host operable instructions is compiled.

18. The system of claim 17, wherein the host is further configured to dynamically generate the memory operable instructions associated with a control flow.

19. The system of claim 18, wherein the host is further configured to dynamically generate the control flow for the program.

20. They system of claim 19, wherein the host is further configured to evaluate the decoded host operable instructions to dynamically generate the memory operable instructions.

* * * * *